United States Patent [19]

Endoh et al.

[11] Patent Number: 4,506,238
[45] Date of Patent: Mar. 19, 1985

[54] HYBRID CIRCUIT DEVICE

[75] Inventors: Kunihisa Endoh, Kawagoe; Yasumitsu Hayakawa, Urawa, both of Japan

[73] Assignee: Toko, Inc., Tokyo, Japan

[21] Appl. No.: 448,630

[22] Filed: Dec. 10, 1982

[30] Foreign Application Priority Data

Dec. 14, 1981 [JP] Japan .............................. 56-18589[U]
Oct. 28, 1982 [JP] Japan ............................ 57-163721[U]

[51] Int. Cl.³ .......................... H03H 7/32; H05K 1/16
[52] U.S. Cl. ................................ 333/138; 174/52 PE; 174/52 FP; 333/140; 339/17 CF; 357/72; 357/74; 357/80; 361/380; 361/395; 361/404
[58] Field of Search ............... 361/380, 421, 404, 405, 361/406; 174/52 FP, 52 PE; 357/68, 70, 72, 74, 80; 333/140, 138, 139; 339/17 CF

[56] References Cited

U.S. PATENT DOCUMENTS 2,926,340 2/1960 Blain et al. ...................... 339/17 CF
3,602,846 8/1971 Hauser ............................. 174/52 PE
4,012,765 3/1977 Lehner et al. ......................... 357/72

Primary Examiner—A. D. Pellinen
Assistant Examiner—Gregory D. Thompson

[57] ABSTRACT

A hybrid circuit device comprising a flat package incorporating an integrated circuit therein, and a delay line constituted by a plurality of coils and capacitors. The base plate having the delay line mounted on one main surface thereof is placed, at the other main surface thereof, on the flat package. Upwardly bent terminals and non-bent terminals are led out of the flat package. The upwardly bent terminals connect the integrated circuit and delay line to each other at side portions of the base plate. Furthermore, separate terminals are provided in two rows holding the flat package therebetween and connected to the non-bent terminals of the flat package. The device is encapsulated, with the free end portion of each of the separate terminals being exposed.

4 Claims, 8 Drawing Figures

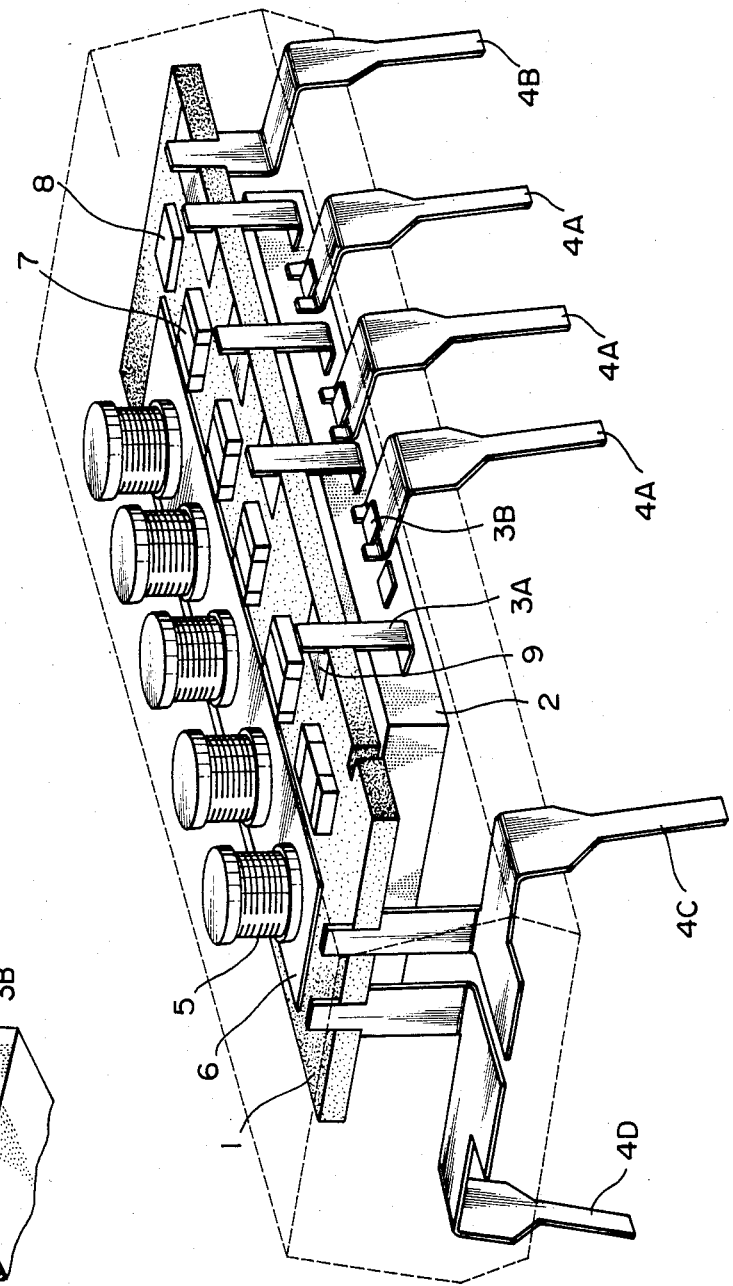
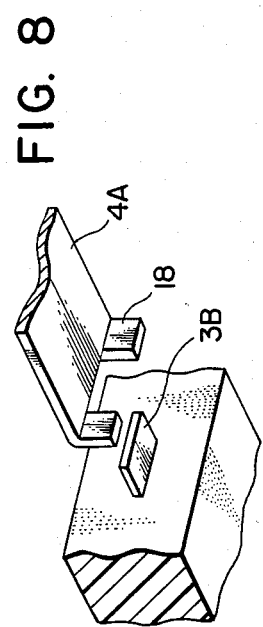

FIG. 6
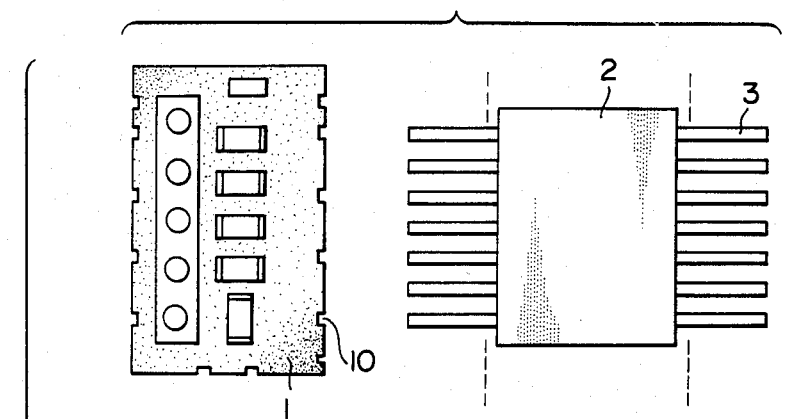
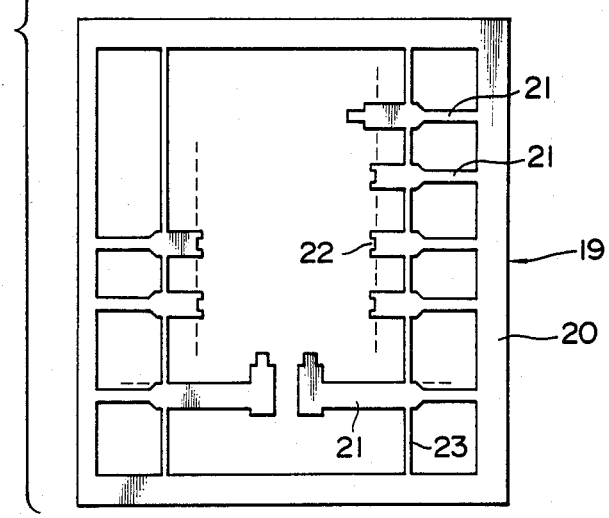
FIG. 7
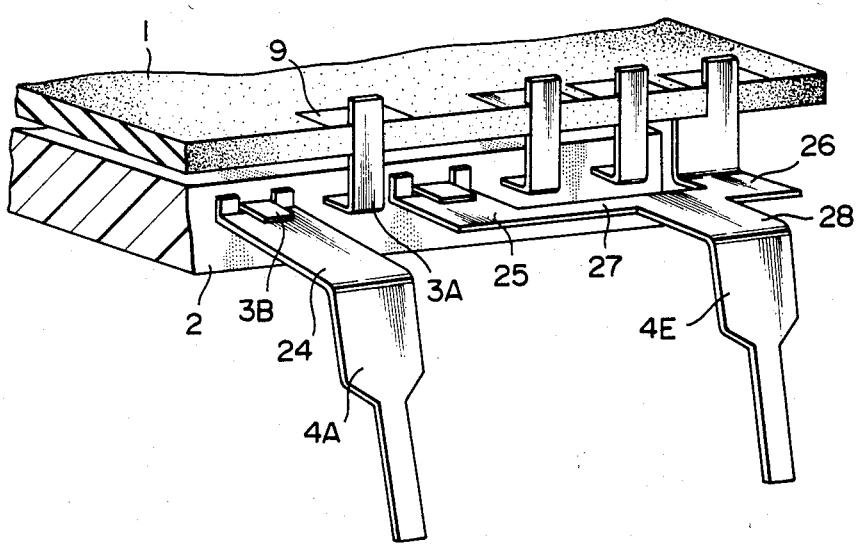

HYBRID CIRCUIT DEVICE

BACKGROUND OF THE INVENTION

1. Field of the Invention

This invention relates to a hybrid circuit device wherein a delay line is externally connected to an integrated circuit.

2. Description of the Prior Art

It is the recent trend that most electronic circuits are provided in the form of an integrated circuit. However, difficulties have been experienced in fabricating, in the form of an integrated circuit, an inductance containing circuit such as a delay line circuit which consists of a combination of coils and capacitors, for example. Thus, in the case of a circuit device including an integrated circuit and an element or elements which are difficult to provide in the form of an integrated circuit, it is required that such elements be externally connected to the integrated circuit. Such requirement also arises when a delay line is to be connected to a saturation type logical circuit such as TTL or the like.

Referring to FIG. 1 of the accompanying drawings, there is shown, in a perspective view, a conventional hybrid circuit wherein a coil 12 and capacitors 13, which together constitute a delay line, are fixedly mounted on a dual in-line package (referred to as DIP hereinafter) 11 of saturation type logical circuit formed by using a transfer molding technique; and the delay line is connected to a saturation type logical circuit which is formed by an integrated circuit, by winding and soldering the lead wires of the delay line onto upwardly bent terminals 15 and downwardly bent terminals 16 of the DIP 11.

As shown by the dotted line in FIG. 1, the foregoing hybrid circuit device is hermetically packaged, as a whole, with a plastic material, with only lower portions of the downwardly bent terminals 16 being exposed below the DIP 11, by using an injection molding technique.

However, the aforementioned conventional arrangement is disadvantageous in that the terminals, which are upwardly bent 180°, of the once completed DIP 11 are weakened and thus liable to be broken. Moreover, tediousness is experienced in carrying out the procedures of winding and soldering the lead wires 14 onto the terminals 15 and 16. More seriously, the solder tends to flow along the terminals, thus making the soldering incomplete. Another disadvantage is that the resulting hybrid circuit device becomes bulkier due to the fact that the DIP, which is bulky in itself, and delay line are plastic-molded together. The size of the thus obtained hybrid circuit device is greater than the standardized size for a DIP provided by means of transfer molding technique; hence, it is not possible to employ a DIP fabricated by using the transfer molding technique. This means that the aforementioned conventional arrangement turns out to be inferior in terms of appearance and commercial value as well as reliability of the plastic-packaging thereof.

SUMMARY OF THE INVENTION

Accordingly, it is an object of the present invention to provide a hybrid circuit device which is so designed as to be miniaturized in size and improved in terms of reliability in connection, thereby eliminating the aforementioned drawbacks of the conventional arrangement wherein a delay line is connected to an integrated circuit.

Briefly, according to the present invention, there is provided a hybrid circuit device characterized in that a base plate for a delay line comprising plural coils and plural capacitors is disposed on a flat package of integrated circuit; some of the terminals of the flat package are upwardly bent so that the delay line circuit and integrated circuit are connected to each other at the sides of the above-mentioned base plate through the upwardly bent terminals; some of the remaining, non-bent, terminals of the flat package are coupled to separate terminals each of which is downwardly bent at an intermediate point thereof in such a manner that the flat package is held at the opposite sides thereof between the separate terminals; the separate terminals are led out in two rows; and plastic packaging is applied onto the entire device with the separate terminals being exposed.

Other objects, features and advantages of the present invention will become apparent from the ensuing description taken in conjunction with the accompanying drawings.

DESCRIPTION OF THE DRAWINGS

FIG. 2 is a perspective view showing the hybrid circuit according to an embodiment of the present invention.

FIG. 6 is a plan view useful for explaining a method of making the hybrid circuit embodying the present invention.

FIG. 7 is a fragmentary perspective view showing the hybrid circuit device according to another embodiment of the present invention.

FIG. 8 is a fragmentary enlarged view showing a modification to the arrangement shown in FIG. 4.

DESCRIPTION OF THE PREFERRED EMBODIMENTS

Figure 1:
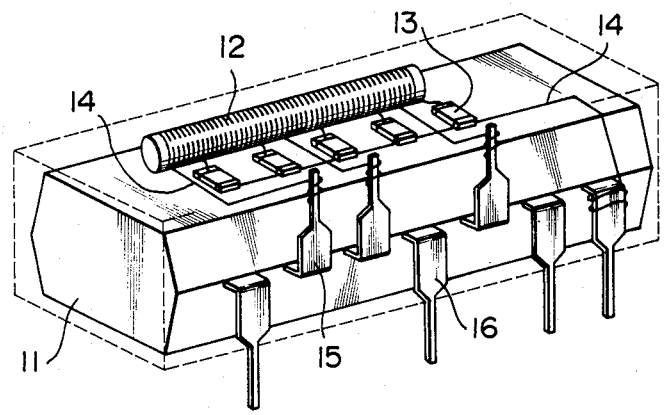
FIG. 1 is a perspective view showing a conventional hybrid circuit device wherein an integrated circuit and a delay line are connected together.

Referring to FIG. 2, description will now be made of the hybrid circuit device according to an embodiment of the present invention.

As will be seen, the hybrid circuit device shown in FIG. 2 comprises a plastic base plate 1; a flat package 2 in which integrated circuit TTL's are provided; two types of terminals 3A and 3B led out of the flat package; terminals 4A, 4B, 4C and 4D which are exposed when the device is packaged with a plastic material; coils 5 each wound on a ferrite core bobbin; a sheet 6 for positioning the core bobbins on which the coils 5 are wound respectively; chip capacitors 7; and a chip resistor 8. The chip capacitors 7 and chip resistor 8 are surface-connected directly to lead patterns 9 provided on the base plate 1.

The coil 5, chip capacitors 7, and chip resistor 8 which is adapted to serve as a terminal resistor, are all disposed on the top surface of the base plate 1 in such a manner that a delay line is formed on the base plate 1, which is placed, at the bottom surface thereof, on the flat package 2. For the sake of simplicity, each of the lead patterns 9, which are provided on the base plate 1 and to which are to be connected the respective circuit elements constituting the delay line, is shown in FIG. 2 only at main side portions thereof which are externally connected to the delay line.

Figure 3:
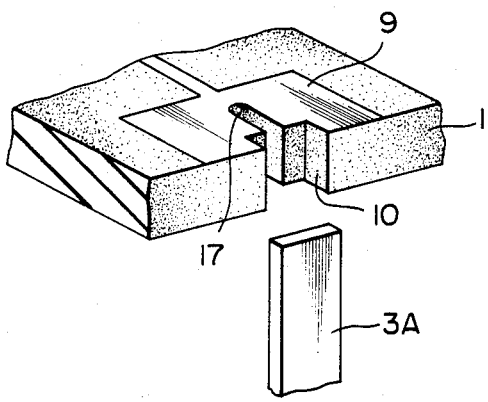
FIGS. 3 and 4 are fragmentary enlarged views of FIG. 2.

The terminals 3A of the flat package 2 are upwardly bent and connected to the delay line at side portion of the base plate 1. As shown in the enlarged perspective view of FIG. 3, the side portion of the base plate 1 is formed with grooves 10 around which the lead patterns are provided. At the bottom of each groove 10 is formed a narrow slit 17 which is adapted to retain a lead wire therein. An intermediate tap lead wire of each coil 5, for example, is inserted in the narrow slit 17 of a respective groove 10 and then soldered. One of the electrodes of each chip capacitor 7, for example, is connected to the lead pattern 9. Furthermore, the terminals 3A of the flat package 2 are fitted in the grooves 10 respectively and soldered to the lead patterns 9 so that connections are established therebetween; thus, the delay line and integrated circuit are connected together. Well known in the art are the manner in which the lead patterns 9 useful for forming a delay line on the base plate 1, are disposed as a whole and the manner in which such patterns are connected to the respective circuit elements; therefore, further description thereof will be omitted, although various modifications thereto will become possible.

Figure 4:
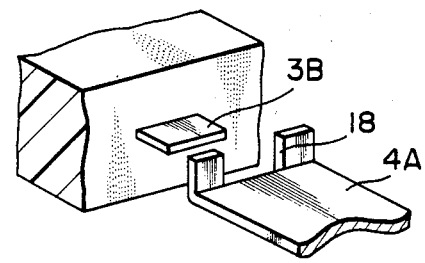

The remaining terminals 3B of the flat package 2, which extend horizontally, are cut short and connected to the terminals 4A except for ones which require no external connection. The terminals 4A are downwardly bent which are provided in two rows at the opposite sides of the flat package 2, although only one of the two rows is shown in FIG. 2 for the convenience of illustration. The terminals 3B and 4A are connected in such a manner as shown in the enlarged perspective view of FIG. 4. More specifically, that portion of each terminal 4A which is connected to a respective one of the terminals 3B is made to be wider than the terminal 3B, upwardly bent at its free end portion, and formed with a notched portion 18 adapted for engagement with the respective terminal 3B. The terminals 3B and 4A are securely connected by being soldered, with their main surfaces being disposed in contact with each other.

The terminals 4B, 4C and 4D are connected to the delay line circuit at the sides of the base plate 1, and adapted to serve as ground terminal, input terminal and high potential terminal of the hybrid circuit device respectively. Each of the side portions of the base plate 1 where the terminals 4B, 4C and 4D are connected, is also provided with a groove and narrow slit which are similar to those mentioned above with respect to the terminals 3A. The terminals 4A are employed as TTL output terminals, and most of the terminals 3A are used as TTL input terminals. The entire device is plastic-molded in the form of DIP, as shown by dotted lines, by means of transfer molding technique, with the terminals 4A, 4B, 4C and 4D exposed.

Figure 5:
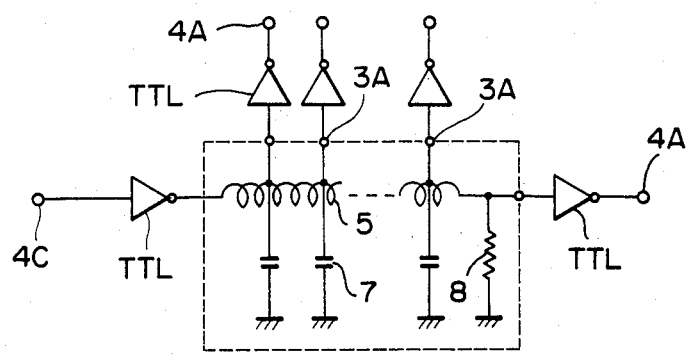
FIG. 5 is a circuit diagram of FIG. 2.

Referring to FIG. 5, there is shown the circuit diagram of the hybrid circuit device of FIG. 2, wherein parts corresponding to those of FIG. 2 are indicated by like reference numerals. The hybrid circuit device is so designed that an input signal is imparted, with a predetermined time delay, to each of the TTL's except for the one connected to the terminal 4C.

With reference to FIG. 6, description will next be made of an example of the method of fabricating the hybrid circuit device shown in FIG. 2. FIG. 6 shows, in plan views, the base plate 1 on which the delay line is provided, the flat package 2 in which the TTL's are incorporated, and a lead frame 19.

Frame 20 of the lead frame 19 is provided with inwardly extending leads 21 which in turn are formed into the terminals 4A, 4B, 4C and 4D respectively. Indicated at 22 are recesses adapted to serve as the notched portions 18 mentioned earlier. The leads 21 are upwardly bent at their free end portions along the dotted lines. Terminals 3 of the flat package 2 are to be used as the terminals 3A and 3B, and those ones of the terminals 3 which are to be used as the terminals 3A are upwardly bent, while those ones of the terminals 3 which are to be employed as the terminals 3B are cut off along the dotted lines. The base plate 1 is placed on the flat package 2, and then the upwardly bent terminals 3 are fitted in grooves 10 formed in the side portions of the base plate 1.

Thereafter, the flat package 2 having the base plate 1 securely mounted thereon is placed on the lead frame 19; the bent leads 21 and horizontally extending cut terminals 3 are connected together; and then those ones of the leads 21 which are provided with no recess 22, are fitted in the grooves 10 of the base plate 1. In such a state, soldering is effected in the neighborhood of the grooves 10, and subsequently, the resultant assembly is plastic-molded by using transfer molding technique. Thereafter, the leads 21 are cut off tie bars 23 and the frame 20 and then downwardly bent. In this way, such hybrid circuit device as shown in FIG. 2 is obtained.

According to the present invention, as mentioned above, the base plate 1 having the delay line circuit mounted thereon is placed on the flat package 2 in which the integrated circuit is incorporated, and the delay line circuit and integrated circuit are connected together at the sides of the base plate 1 through the bent terminals 3A of the flat package 2. Further, the terminals 3B of the flat package 2 are connected to the separate terminals 4A and led out of the DIP. Thus, unlike the conventional hybrid circuit device in which the terminals of the DIP thereof are bent 180°, the present device is free from the possibility that the terminals thereof are weakened to be broken. By virtue of the fact that the terminals 3A of the flat package 2 are soldered to the lead patterns 9 of the delay line, it is possible not only to eliminate the tedious procedure of winding lead wires onto the terminals but also prevent melted solder from flowing along the terminals. More positive soldering can be achieved with the terminals 3A fitted in the grooves 10 as in the aforementioned embodiment. Furthermore, reliable connections can also be secured between the terminals 4A and 3B by making the terminals 4A wider than the terminals 3B, fitting the terminals 3B in the notched portions 18 of the terminals 4A and then soldering the terminals 4A and 3B together as in the above-described embodiment.

According to the present invention, a flat package, which is smaller than DIP, is employed as package for integrated circuit, so that the entire dimension of the assembly comprising the flat package and the delay line base plate placed thereon falls within the range for allowing the assembly to be plastic-molded in the form of DIP using transfer molding technique. The thickness of the final product can further be reduced by mounting circuit elements such as coils, capacitors and so forth which constitute the delay line, on one main surface of the base plate and placing the base plate, at the other main surface thereof where no circuit elements are present, on the flat package. Thus, the present hybrid circuit device can be plastic-molded by using transfer molding technique so that it can be improved in terms of external appearance and miniaturized. In addition, when mounted on a printed circuit board or the like, the present hybrid circuit device makes it possible to achieve an enhanced mounting density.

As will be appreciated, the present hybrid circuit device can easily be fabricated simply by preparing the base plate 1 for mounting the delay line thereon, the integrated circuit flat package 2, and the lead frame 19 separately, placing the flat package 2 and base plate 1 on the lead frame 19 in the named order, and then plastic-molding the resultant structure.

In the hybrid circuit device shown in FIG. 2, at the connections between the terminals 4A exposed out of the DIP and the terminals 3B of the flat package, the terminals 4A assume the same positions and extend in the same directions as the terminals 3B, and are bent downwardly as they are. In some cases, however, the design is made such that the terminals 3B and the exposed terminals 4A are disposed out of positional registration with each other. More specifically, positioning of the terminals 4A is determined according to a customer's specification, and thus it may happen that some of the terminals 4A and respective ones of the terminals 3B of the flat package 2 which are to be connected thereto, are out of positional registration with each other. Obviously, the hybrid circuit device shown in FIG. 2 is unsuitable in such a case.

Referring to FIG. 7, there is shown the hybrid circuit device according to another embodiment of the present invention, which is so designed as to cope with the situation mentioned just above.

FIG. 7 is a fragmentary perspective view showing a corner portion of the hybrid circuit device prior to being plastic-molded. A better understanding will be had by referring to FIGS. 2 and 7 together. Hence, parts of FIG. 7 corresponding to those of FIG. 2 are indicated by like reference numerals.

The arrangement shown in FIG. 7 includes a base plate 1 of a plastic material, and a flat package 2 incorporating integrated circuit TTL's. Indicated at 3A and 3B are terminals of the flat package 2, and shown at 4A and 4B are terminals which are exposed when the assembly is plastic-molded.

Provided on the base plate 1 is a delay line which comprises various circuit elements such as shown in FIG. 2, although not shown in FIG. 7.

In FIG. 7, the terminals 3A of the flat package 2 are upwardly bent and connected, at sides of the base plate 1, to the delay line. The side portions of the base plate 1 are of construction similar to that shown in FIG. 3. The terminals 3A are connected to lead patterns 9 provided on the side portions of the base plate 1. One of the terminals 3B, which are cut short, of the flat package 2 is connected to the terminal 4A. The connecting portion between the terminals 3B and 4A is of construction similar to that explained above with reference to FIG. 4. The terminal 4A has a horizontal surface portion 24 which is in positional registration with the terminal 3B and extends in the same direction as the terminal 3B. Further, the terminal 4A is downwardly bent at the end of the horizontal surface portion 24 thereof. The other one of the terminals 3B is connected to a terminal 4E which is different in configuration from the terminal 4A. The flat package side end of the terminal 4E is configured in a U shape and includes a left hand side horizontal surface portion 25 and a right hand side horizontal surface portion 26 which are connected together through another horizontal surface portion 27. The horizontal surface portions 25 and 26 are disposed in parallel relationship with each other and upwardly bent at their fore ends. Needless to say, the horizontal surface portion 27 is configured to be out of contact with the terminals 3A which are located inside of the horizontal surface portion 27. The left hand side horizontal surface portion 25 is located at the same position and extends in the same direction as the terminal 3B. The free end of the horizontal surface portion 25 is configured in the same manner as the terminal 4A, and connected to the terminal 3B. The right hand side horizontal surface portion 26 is provided with an upright portion which extends upwardly beyond the top surface of the base plate 1. The upright portion of the horizontal surface portion 26 comprises a wider portion and a narrower portion which is fitted in a groove formed in a groove formed in the side of the base plate 1 in the same manner as the terminal 3A, and secured to respective one of the lead patterns 9 by means of soldering. A further horizontal surface portion 28 is provided which extends from the horizontal surface portion 27 in the direction opposite to that of the horizontal surface portions 25 and 26. The horizontal surface portion 28 is downwardly bent at the free end portion. In this way, the terminal 4E is formed. The terminal 4E is connected to the terminal 3B of the flat package 2 at one end of the U-shape thereof, and securely attached to the base plate 1 at the other end thereof. The lead pattern 9 provided on that portion of the base plate 1 where the terminal 4E is securely attached to the base plate 1, may be a lead pattern to which no circuit element is connected, i.e., a vacant lead pattern. Thus, the position where the terminal 4E is exposed externally of the DIP can be determined simply by selecting the position where the horizontal surface portion 28 is led out of the horizontal surface portion 27, independently of the position of the terminal 3B. Furthermore, a high terminal strength can be achieved by virtue of the fact that the terminal 4E is securely attached at the two ends thereof. Obviously, if the terminal 4E were configured in a crank-like form which is void of the right hand side portion to be securely attached to the base plate 1, and connected to the terminal 3B alone, then the resulting product could not be put to practical use since the terminal strength would be so low that the terminal would be liable to be broken. Although in the embodiment of FIG. 7, the terminal 4E was connected, in a corner portion of the hybrid circuit device, to the terminal 3B which is disposed at a position deviated from that portion of the terminal 4E which is exposed, it is to be understood that no limitation is laid upon the position where the terminal 4E is located in the hybrid circuit device of this invention. It goes without saying that the assembly shown in FIG. 7 can also be fabricated by using a lead frame as mentioned above with reference to FIG. 6.

With the construction shown in FIG. 7, connection between the terminal 3B of the flat package 2 and the terminal to be exposed can be achieved without any inconvenience even when the position of the terminal to be exposed has previously been determined. It will readily be appreciated that this leads to enhanced freedom in designing.

While the present invention has been described and illustrated with respect to specific embodiments thereof, it is to be understood that the present invention is by no means limited thereto but covers various changes and modifications which will become possible within the scope of the appended claims. Although the terminals 4A were upwardly bent and formed with recess 18 at the free end thereof, it is possible that the terminals 4A may be downwardly bent at the free end thereof; in such a case, the terminals 3B can be disposed below the terminals 4A and fitted in the recesses thereof as shown in FIG. 8. This is also applicable to the terminal 4E. Needless to say, this invention is applicable not only to an integrated logical circuit such as TTL or the like but also to various other types of integrated circuits. As will be appreciated, according to the present invention, it is possible to provide a hybrid circuit device which of a high productivity, miniaturized construction and high reliability.

What is claimed is:

1. A hybrid circuit device comprising:
   a flat package incorporating an integrated circuit therein;
   a delay line circuit comprising a plurality of coils and a plurality of capacitors;
   a base plate supporting said delay line circuit, said base plate being disposed on said flat package;
   upwardly bent terminals led out of said flat package and connecting said delay line circuit and said integrated circuit to each other at side portions of said base plate;
   non-bent terminals led out of said flat package;
   separate terminals connected to said non-bent terminals respectively, said separate terminals being downwardly bent in such a manner as to be led out in two rows, in the form of dual line package, holding said flat package therebetween; and
   encapsulation surrounding said base plate and said package, with the free end portion of each of said separate terminals being exposed through said encapsulation.

2. A hybrid circuit device according to claim 1, wherein the connecting portions between the terminals of said flat package and said separate terminals are arranged such that said separate terminals are made to be greater in width than the terminals of said flat package; said separate terminals are bent at the flat package side end thereof upwardly; a recess is formed in the end portion of each of said separate terminals; and the terminals of said flat package are disposed in engagement with said recesses.

3. A hybrid circuit device according to claim 1, wherein the flat package side end of at least one of said separate terminals is configured in a U-shaped form; one leg of the U-shape is connected to a respective one of the non-bent terminals of said flat package; and the other leg of the U-shape is securely attached to the side of the base plate for the delay line.

4. A hybrid circuit device according to claim 1, wherein the connecting portions between the terminals of said flat package and said separate terminals are arranged such that said separate terminals are made to be greater in width than the terminals of said flat package; said separate terminals are bent at the flat package side end thereof downwardly; a recess is formed in the end portion of each of said separate terminals; and the terminals of said flat package are disposed in engagement with said recesses.

* * * * *